United States Patent [19]

Kurokawa et al.

[11] Patent Number: 5,360,483
[45] Date of Patent: Nov. 1, 1994

[54] PLASMA CVD APPARATUS AND METHOD THEREFOR

[75] Inventors: Hideo Kurokawa, Katano; Tsutomu Mitani, Akashi; Hirokazu Nakaue, Higashiosaka, all of Japan

[73] Assignee: Matsushita Electric Industrial Co., Ltd., Osaka, Japan

[21] Appl. No.: 30,557

[22] Filed: Mar. 12, 1993

[30] Foreign Application Priority Data

Mar. 13, 1992 [JP] Japan ................. 4-055144

[51] Int. Cl.⁵ ............................. C23C 16/00
[52] U.S. Cl. ............... 118/723 E; 118/723 ER; 315/111.21; 204/298.01
[58] Field of Search ............ 315/111.21; 118/723 E, 118/723 ER, 723 MW, 723 ME; 204/298.01

[56] References Cited

U.S. PATENT DOCUMENTS

| | | | |
|---|---|---|---|
| 3,898,952 | 8/1975 | Shirahata et al. | 118/723 VE |
| 4,301,765 | 11/1981 | Behn et al. | 118/723 VE |
| 4,645,977 | 2/1987 | Kurokawa et al. | 315/111.81 |
| 4,647,818 | 3/1987 | Ham | 315/111.81 |
| 4,655,167 | 4/1987 | Nakamura et al. | 118/723 VE |
| 4,673,588 | 6/1987 | Bringmann et al. | 118/723 E |
| 4,863,756 | 9/1989 | Hartig et al. | 118/723 E |
| 5,110,437 | 5/1992 | Yamada et al. | 118/723 E |

FOREIGN PATENT DOCUMENTS

| | | |
|---|---|---|
| 0174024 | 3/1986 | European Pat. Off. |
| 0183254 | 6/1986 | European Pat. Off. |
| 0194675 | 9/1986 | European Pat. Off. |
| 0411435 | 2/1991 | European Pat. Off. |

*Primary Examiner*—John T. Kwon
*Attorney, Agent, or Firm*—Wenderoth, Lind & Ponack

[57] ABSTRACT

A plasma CVD apparatus for continuously forming a diamond-like film on a length of magnetic tape, includes a first vacuum vessel, a plasma generating vessel for transforming a gaseous medium into a plasma, and an electrode for accelerating ions of the plasma toward the substrate. The plasma generating vessel has a gas outflow port of a shape complementary to that of the portion of the magnetic tape readied for deposition. A portion of the plasma generating vessel is disposed within the vacuum vessel, with the gas outflow port facing the substrate. A gap between the substrate and the gas outflow port is set to maintain the pressure of plasma in the gap uniform.

10 Claims, 5 Drawing Sheets

PLASMA CVD APPARATUS AND METHOD THEREFOR

BACKGROUND OF THE INVENTION

1. Field of the Invention

The present invention relates to an apparatus for, and a method of, making a hard carbon film, or a so-called diamond-like carbon film, having various physical properties comparable to those of a diamond.

2. Description of the Prior Art

Since it has been discovered that a diamond could be synthesized by means of a low-pressure vapor deposition process, numerous reports have been made on various methods for the formation of diamond films and the synthesis of diamond-like carbon films, an example of which includes that made by H. Vora and T. J. Moravec (J. Appl. Phys. 52 6151, 1981). Any of those prior art methods comprises the use of a gaseous hydrocarbon such as, for example, $CH_4$ or $C_2H_6$ which is transformed into a plasma so that radicals and/or ions contained in the plasma can be utilized to synthesize a diamond film or a diamond-like carbon film. In recent years, various improved systems and apparatuses have been suggested whereby a diamond film or diamond-like carbon film can be fabricated by various devices.

The inventors have suggested in, for example, U.S. Pat. No. 4,645,977, a plasma injection CVD (chemical vapor deposition) method effective to synthesize the diamond-like carbon film on a film-like substrate continuously at a high speed. The plasma injection CVD apparatus used to carry out this method is schematically illustrated in FIG. 9. As shown therein, the apparatus comprises a plasma tube 25, equipped with a plasma generating means, and a vacuum vessel 27 for accommodating a substrate 26. The plasma tube 25 and the vacuum vessel 27 communicate with each other so that a gaseous medium introduced into the plasma tube can flow into the vacuum vessel 27 through a nozzle 28. The gaseous medium introduced into the plasma tube 25 is transformed into a plasma by means of an RF power applied to an RF coil 30, and the plasma is then blown onto the substrate 26 by the effect of a pressure difference between the plasma tube 25 and the vacuum vessel 27. At this time, ions contained in the plasma are accelerated by the difference in potential between an accelerator electrode 29, installed inside the plasma tube 25, and the substrate 26 to impinge the substrate 26. Thus, the flow of the plasma of the hydrocarbon gas containing the accelerated ions makes it possible to maximize the use of the ions and radicals in forming the diamond-like carbon film at a high speed.

However, the plasma injection CVD method has been found to have the following problem. The speed at which the diamond-like carbon film is synthesized depends on the number of the ions and radicals that reach the substrate. On the other hand, the number of the ions and radicals is based on the pressure of the plasma tube, the type of the gaseous medium used and the electric power invested. Therefore, in order to increase the speed at which the diamond-like carbon film is synthesized, the plasma tube should be evacuated to a pressure as low as possible. In addition, since the plasma injection CVD method makes use of the difference in pressure between the plasma tube and the vacuum vessel to cause the radicals of the plasma to flow this pressure difference should be as large as possible in order to increase the speed at which the diamond-like carbon film is synthesized.

However, since the difference in pressure between the plasma tube and the vacuum vessel is limited by the flow resistance imposed by the nozzle, in order for the pressure difference between the plasma tube and the vacuum vessel to be increased while the pressure inside the plasma tube is maintained low, the flow resistance imposed by the nozzle must be increased. Because of this, the opening of the nozzle must be as small as possible and this is limited due to the incompatibility between the increase in speed at which the diamond-like carbon film is synthesized and a large surface area over which the diamond-like carbon film is to be synthesized.

Also, according to the plasma injection CVD method, in order to accelerate the ions, a mesh-like electrode is installed within the plasma tube and a positive potential is applied to the electrode. At this time, the plasma exhibits a potential substantially equal to that developed at the mesh-like electrode and the plasma ions are accelerated by the effect of a potential difference between the plasma and the substrate. When the plasma is blown from the nozzle onto the substrate, a portion of the plasma diffuses into the vacuum vessel and this may often constitute a cause of an abnormal discharge. The lower the vacuum exhibited by the pressure inside the plasma tube, the greater the amount of the plasma diffused into the plasma tube and, hence, the more often does the abnormal discharge occur. Since the plasma injection CVD method entails blowing the plasma onto the substrate, the uniformity of pressure at a film forming portion is limited, and it has been found that the uniformity of the film thickness was limited to $\pm 5\%$ at an area corresponding to the cross-section of the nozzle. Because of this, in applications in which uniformity is an important factor (for example, when providing a protective film on a magnetic tape), a further improvement in uniformity of the film thickness is desired.

SUMMARY OF THE INVENTION

The present invention has been devised to substantially eliminate the above discussed problems and is intended to provide an improved plasma CVD apparatus capable of synthesizing a diamond-like carbon film of uniform film thickness and of a relatively large surface area at a high speed and which operates stably with a minimized possibility of an abnormal discharge.

To this end, the present invention provides a plasma CVD apparatus which comprises a first vacuum vessel enclosing a substrate on which a film is desired to be formed; a second vacuum vessel fluid-connected with a source of a raw gaseous medium and having a gas outflow port from which a plasma of the raw gaseous medium introduced into the second vacuum vessel is discharged; and plasma generating means for transforming the raw gaseous medium, introduced from the raw gaseous medium source into the second vacuum vessel, into plasma within the second vacuum vessel.

The gas outflow port is so shaped as to conform to the shape of the surface of the substrate, while the second vacuum vessel is accommodated within the first vacuum vessel with the gas outflow port oriented towards and spaced apart from the surface of the substrate with a gap formed therebetween. The gap is of a size small enough to permit the pressure of the plasma, discharged from the gas outflow port into the gap, to be uniform at any location within the gap.

The apparatus also comprises electric field generating means for directing ions of the plasma, discharged from the gas outflow port into the gap, towards the substrate.

The present invention also provides a method of forming, by the use of a plasma CVD technique, a film on a surface of a substrate within a vacuum vessel. This method comprises supplying a plasma into the vacuum vessel under a pressure higher than the pressure inside the vacuum vessel; developing an electric field acting on the plasma gas for directing ions of the plasma towards the substrate; and forming the film of elements of the plasma.

The plasma supply is carried out by passing the plasmas through a plasma gas outflow port of a shape conforming to the shape of the surface of the substrate and disposed proximate the surface of the substrate while leaving a sufficiently small gap therebetween such that, within the gap, the plasma gas has a substantially uniform pressure higher by at least one figure (an order of ten) than the pressure inside the vacuum vessel.

According to the present invention, the surface of the substrate on which the film is desired to be formed and the gas outflow port of a shape conforming to the surface of the substrate are spaced apart by a small distance. Since the gas outflow port has a shape conforming to the surface of the substrate, the gap therebetween is uniform.

Since the substrate surface and the gas outflow port are close, the amount of plasma emerging outwardly from the gas outflow port can be controlled to a properly selected small value as compared with the amount of the plasma generated. Therefore, a sufficient amount of the plasma gas accumulates within the gap and the plasma pressure is increased. In other words, because a proper amount of the plasma is accumulated in the gap, the plasma is stably supplied to the substrate surface and the pressure of the plasma within the gap is substantially uniform and higher by at least one figure (an order of ten) than the pressure inside the vacuum vessel. Therefore, film forming conditions under which the film is formed on the substrate surface are stable.

Also, because the rate of flow of the plasma from the plasma outflow port is so controlled as described above, the diffusion of the plasma is advantageously minimized thereby minimizing the possibility of an abnormal discharge which would otherwise occur as a result of the diffusion of the plasma. When the pressure of the plasma is higher by one or more figures than the pressure inside the vacuum vessel and the pressure inside the vacuum vessel is lower than that at which the discharge can be maintained, any undesirable discharge within the vacuum vessel can be avoided.

When a diamond-like carbon film is to be formed with the use of the above discussed plasma CVD method, the radicals of the plasma increase and, therefore, the film quality tends to be deteriorated. The diamond-like carbon film is generally regarded as a structure in which diamond bonds (SP3 bonds) and graphite bonds (SP2 bonds) are mixed, and the greater the number of the SP3 bonds, the more the structure is characteristic of a diamond. Since under ordinary environments the SP2 bonds are rather stable, energy is required to render the carbon ions of the plasma into the SP3 bonds.

In the present invention, an electric field accelerates the ions of the plasma to increase the energy of ion bombardment to thereby correspondingly increase the SP3 bonds for the purpose of providing a diamond-like carbon film of high quality.

BRIEF DESCRIPTION OF THE DRAWINGS

These and other objects and features of the present invention will become clear from the following description taken in conjunction with preferred embodiments thereof with reference to the accompanying drawings, in which like parts are designated by like reference numerals and in which.

DETAILED DESCRIPTION OF THE PREFERRED EMBODIMENTS

Figure 1:
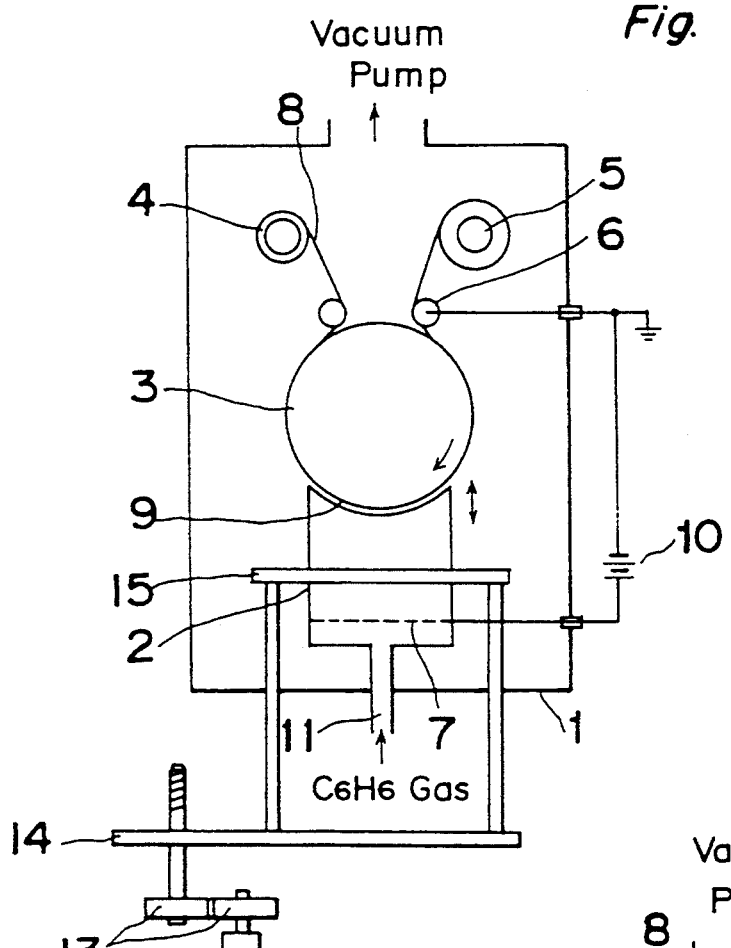
FIG. 1 is a schematic diagram of one preferred embodiment of a plasma CVD apparatus according to the present invention.

Referring to FIG. 1, the present invention is shown as applied to the formation of a diamond-like carbon film on a magnetic tape and, for this purpose, there is provided a magnetic tape transport system for transporting a continuous length of magnetic tape to a thin film forming unit where a diamond-like film is formed over a magnetic layer of the magnetic tape.

Specifically, a first vacuum vessel 1 has a tape transport system accommodated therein and including a supply roller 5 supporting a roll of magnetic tape 8, a drum 3 adapted to be driven at a peripheral speed substantially equal to the speed of transport of the magnetic tape 8 and around which the magnetic tape 8 drawn from the supply roller 3 is guided, a take-up roller 4 for winding up the magnetic tape 8 having been guided by the drum 3, and a tensioning roller 6 for imparting a proper tension to the magnetic tape 8 while the latter is guided around the drum 3.

The length of magnetic tape 8 is drawn from a supply roller 5 and is wound around a take-up roller 4 after having travelled around the drum 3. As a matter of course, the drum 3 is ordinarily cooled by a known cooling means such as, for example, a water cooling system, to prevent an increase of temperature thereof during an operation of the apparatus.

As shogun in FIG. 1, the tensioning roller 6 which is electrically grounded contacts the magnetic layer of the magnetic tape 8 to connect the magnetic layer of the magnetic tape 8 electrically to the ground. The other component parts of the tape transport system including the drum 3 are electrically insulated.

In the illustrated embodiment, the drum 3 has a diameter of about 800 mm and a length of about 280 mm as measured in a direction parallel to the axis of rotation of the drum 3, that is, in a direction perpendicular to the sheet of FIG. 1. A second vacuum vessel 2 (hereinafter referred to as a plasma generating tube because plasma necessary to form a diamond-like thin film is generated in this vessel) is positioned immediately beneath the drum 3 and has a gas outflow port 9 defined therein. The gas outflow port 9 in the illustrated embodiment has a width of about 600 mm as measured in a direction conforming to the curvature of the drum 3 and a length of about 250 mm as measured in a direction parallel to the axis of rotation of the drum 3. As will be described later, the plasma generating tube 2 is so positioned that the distance of separation between the outer peripheral surface of the drum 3 and the gas outflow port 9 is uniform over the entire surface area of the gas outflow port 9.

The plasma generating tube 2 is supported on a positioning mechanism comprising a motor 12, gears 13, a movable platform 14, and a support framework 15, and which mechanism is so designed as to adjust the distance of separation between the peripheral surface of the drum 3 and the gas outflow port 9 of the plasma generating tube 2. The plasma generating tube 2 has an electrode 7 installed therein and connected with an electric power source 10 to produce a potential difference between the electrode 7 and the magnetic layer of the magnetic tape 8.

As a raw gaseous material, $C_6H_6$ gas is used and is introduced into the plasma generating tube 2 through a gas supply line 11. At this time, the distance of separation between the gas outflow port 9 and the peripheral surface of the can roller 3 and the flow rate of the $C_6H_6$ gas are adjusted so that the pressure difference between the plasma generating tube 2 and the vacuum vessel 1 can attain a value in the order of more than a single figure. If this pressure difference is insufficient, not only would an uneven pressure be developed at the gas outflow port 9, but also a portion of the plasma generated within the plasma generating tube 2 would flow into the vacuum vessel 1, thereby causing film to form at an unwanted area and an abnormal discharge.

After the pressure inside the plasma generating tube 2 has been stabilized, an electric potential required to cause the electrode 7 to have a positive potential is applied between the electrode 7 and the magnetic layer of the magnetic tape 8 to cause the plasma generating tube 2 to generate the plasma. Ions contained in the plasma so generated are accelerated by the effect of the potential difference between the electrode 7 and the magnetic layer of the magnetic tape 8 to impinge on the magnetic layer of the magnetic tape 8 thereby forming a diamond-like carbon film together with radicals contained in the plasma.

One example of film forming conditions is shown in Table 1. In Table 1, the current density in the magnetic layer refers to the amount of ions flowing into that portion of the magnetic layer of the magnetic tape 8 which is then situated within a gap between the gas outflow port 9 and the outer peripheral surface of the drum 3.

TABLE 1

| Pressure inside Tube 2 | 10 to 15 Pa |
|---|---|
| Pressure inside Vessel 1 | 0.1 Pa |
| $C_6H_6$ Flow Rate | 12 SCCM |
| Potential Difference between 6 and 7 | 3 kV |
| Current Density in Magnetic Layer | 0.1 mA/cm$^2$ |

As a result of the film formation under the above tabulated conditions, over the entire area of the gas outflow port 9 (250 mm in length and 600 mm in width), a film of 3,000 kg/mm$^2$ in Vickers hardness could be synthesized at a speed higher than 300 nm per minute. Consequently, it has become possible to form the diamond-like carbon film of 10 nm in thickness uniformly (with ±2% in variation in film thickness) over a surface of the length of magnetic tape 8 transported at a speed of 18 m per minute.

An important aspect of the present invention lies in that the pressure of the plasma generated from the plasma generating tube 2 and flowing into the first vacuum vessel 1 through the gas outflow port 9 is maintained at a uniform value at any local portion of the gap between the peripheral surface of the drum 3 and the gas outflow port 9. This can be accomplished by using the positioning mechanism comprising the motor 12 to adjust the gap between the peripheral surface of the drum 3 and the gas outflow port 9. If the gap between the gas outflow port 9 and the peripheral surface of the drum 3 is too large as compared with the flow rate of the gas discharged from the gas outflow port 9, the flow of the plasma emerging outwardly from the gas outflow port 9 will become unstable, making it difficult to achieve a uniform pressure over the entire area of the gap.

Accordingly, in order to achieve the uniform pressure over the entire area of the gap, it is necessary to set the distance of separation between the peripheral surface of the drum 3 and the gas outflow port 9 to a relatively small value. By selecting the distance of separation to be of the small value, the gas flow from the plasma generating tube 2 can be properly controlled to a small value as compared with the amount of the plasma produced within the plasma generating tube 2 and, consequently, not only can a sufficient amount of plasma be accumulated within the plasma generating tube as compared with the amount of the plasma discharged outwardly from the gas outflow port 9, but the gas pressure of the plasma can also be increased. Therefore, while the proper amount of the plasma is accumulated within the plasma generating tube 2, the amount of the plasmas produced and the amount of the plasma discharged are balanced with each other, making it possible to accomplish a stabilized supply of the plasma gas to the gap while the gas pressure at the gap is kept uniform.

So far as the illustrated embodiment is concerned, the distance of separation is deemed optimum if it is about 0.3 μm, but not exceeding 1 μm. Since in the illustrated embodiment the radius of curvature of the gas outflow port 9 and the radius curvature of the peripheral surface of the drum 3 are identical with each other, the distance of separation is not uniform if strictly measured in a direction lengthwise of the drum 3. However, in terms of the purpose of equalizing the pressure of the plasma gas at any local positions within the gap between the peripheral surface of the drum 3 and the gas outflow port 9, the distance of separation of about 0.3 mm may be regarded as a uniform gap size.

As hereinabove described, the foregoing embodiment of the present invention is effective to form a diamond-like film of uniform film thickness at a high speed. The diamond-like film formed on the surface of the magnetic layer has shown no problem in bondability thereof with the magnetic layer, and has shown an excellent wear resistance, proving that the resultant diamond-like film could be used as a sufficient and effective protective layer.

Figure 2:
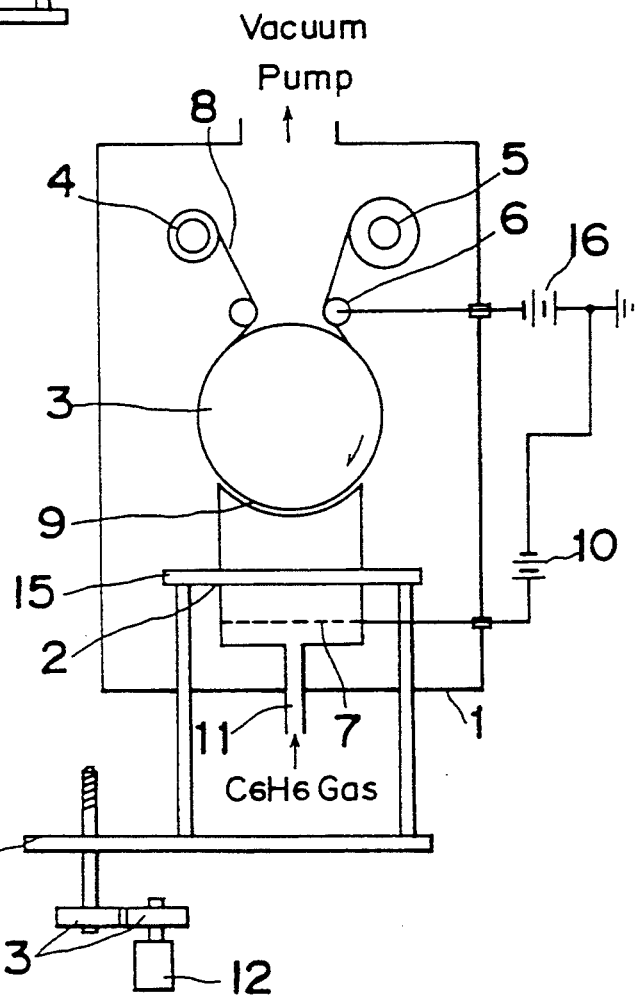
FIG. 2 is a schematic diagram of a modified form of the plasma CVD apparatus shown in FIG. 1.

It is to be noted that the magnetic layer of the magnetic tape 8 has been electrically grounded through the tensioning roller 6. However, it need not be held at a ground potential, but may be connected with a direct current source 16 such as shown in FIG. 2. In the modification shown in FIG. 2, since the potential difference is produced between the magnetic layer and the drum 3 (ground potential), this potential difference assists the magnetic tape 8 to strongly adhere to the drum 3. While the drum 3 is notionally water-cooled to prevent an increase of temperature during the film formation and to prevent the magnetic tape 8 from being thermally damaged and an emission of gases therefrom, the application of an electric potential to the magnetic layer to cause the magnetic tape 8 to stick to the drum 3 is effective to stabilize the film forming conditions.

Also, while in the embodiment shown in and described with reference to FIG. 1 a ratio between the pressure inside the first vacuum vessel and that inside the plasma generating tube has been chosen to be in the order of two figures, the ratio of pressure in the order of a single figure is sufficient to accomplish the formation of the diamond-like carbon film at a high speed as compared with the prior art method with the resultant diamond-like film being advantageously usable as a protective layer.

Figure 3:
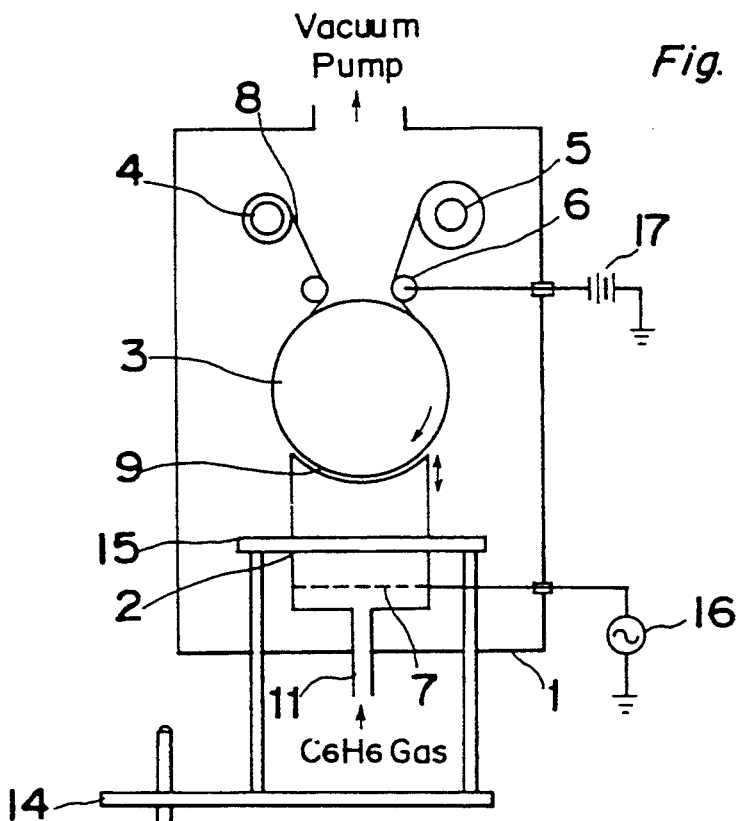
FIG. 3 is a schematic diagram of a second preferred embodiment of the plasma CVD apparatus according to the present invention.

FIG. 3 illustrates the second embodiment of the plasma CVD apparatus according to the present invention. While in the foregoing embodiment a direct current power source 10 is employed as means for generating the plasma, the plasma CVD apparatus according to FIG. 3 employs an alternating current of a frequency at 13.56 kHz. In this embodiment, the magnetic layer of the magnetic tape is impressed with a negative potential from the direct current power source 17 through the tensioning roller 6. One example of film forming conditions is shown in Table 2 and, as shown in Table 2, the ratio between the pressure inside the plasma generating tube 2 and that inside the vacuum vessel 1 is in the order of two figures.

TABLE 2

| Pressure inside Tube 2 | 10 Pa |
| Pressure inside Vessel 1 | 0.1 Pa |
| $C_6H_6$ Flow Rate | 8 SCCM |
| Potential of Magnetic Layer | −2 kV |
| Current Density in Magnetic Layer | 0.05 mA/cm$^2$ |
| AC Power applied to Electrode 7 | 150 W |

As a result of the film formation under the conditions tabulated in Table 2, over the entire area of the gas outflow port 9 (250 mm in length and 600 mm in width), a film of 2,500 kg/mm$^2$ in Vickers hardness could be synthesized at a speed higher than 400 nm per minute. Consequently, it has become possible to form the diamond-like carbon film of 10 nm in thickness uniformly (with ±2% or smaller in variation in film thickness) over a surface of the length of magnetic tape 8 traveling at a rate higher than 24 m per minute.

In the practice of the second embodiment of the present invention, the negative potential need not always be impressed on the magnetic layer by a direct current power source, as an alternating current potential may be impressed instead so that a self-biasing effect thereof can be utilized. Also, the frequency of the alternating current to be applied to the electrode 7 is not limited.

Figure 4:
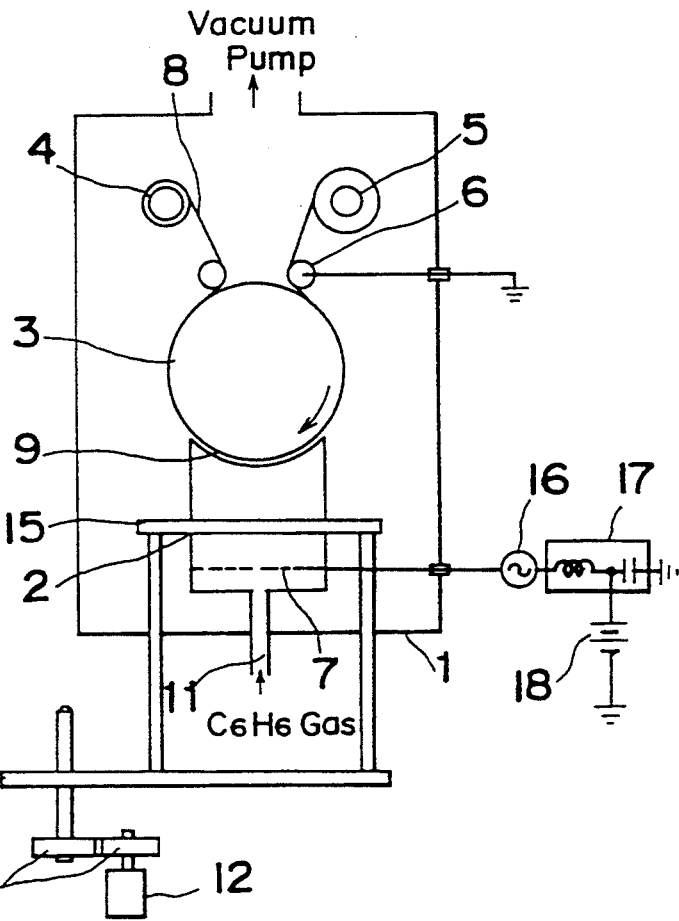
FIG. 4 is a schematic diagram of a modified form of the plasma CVD apparatus shown in FIG. 3.

Similar effects can be obtained even when the AC potential superimposed with a negative DC potential is applied to the electrode 7 such as shown in FIG. 4. This can be accomplished by superimposing a DC potential, supplied from a direct current power source 18 through a low-pass filter 17, on the DC potential supplied from the AC power source 16 and, in this instance, the magnetic layer of the magnetic tape may be grounded.

In the practice of the second embodiment of the present invention, a favorable film formation is possible particularly if the pressure ratio between the first and second vacuum vessels is in the order of one or more figures.

Figure 5:
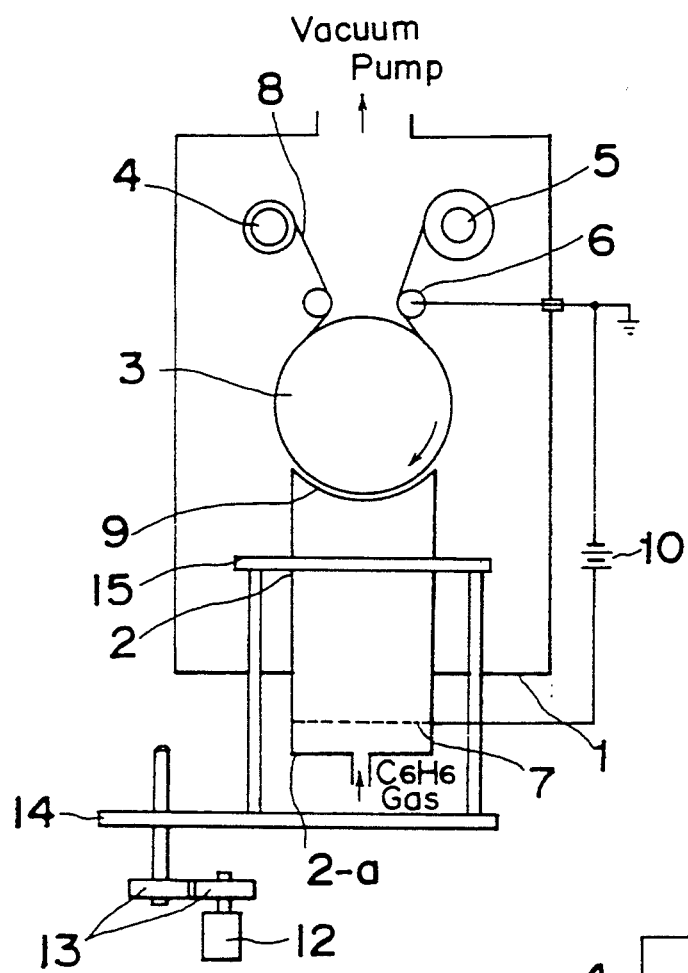
FIG. 5 is a schematic diagram of another modified form of the plasma CVD apparatus shown in FIG. 3.

It is to be noted that the plasma generating tube 2 in its entirety may not be completely enclosed within the vacuum vessel 1, but a portion thereof may be situated outside the vacuum vessel 1 as shown by 2-a in FIG. 5, and even this arrangement is free from problems. The arrangement in which a portion of the plasma generating tube 2 is situated outside the vacuum vessel 1 as shown in FIG. 5 is particularly advantageous where the AC power source is employed as means for generating the plasma, an example of which is shown in FIG. 6.

Figure 6:
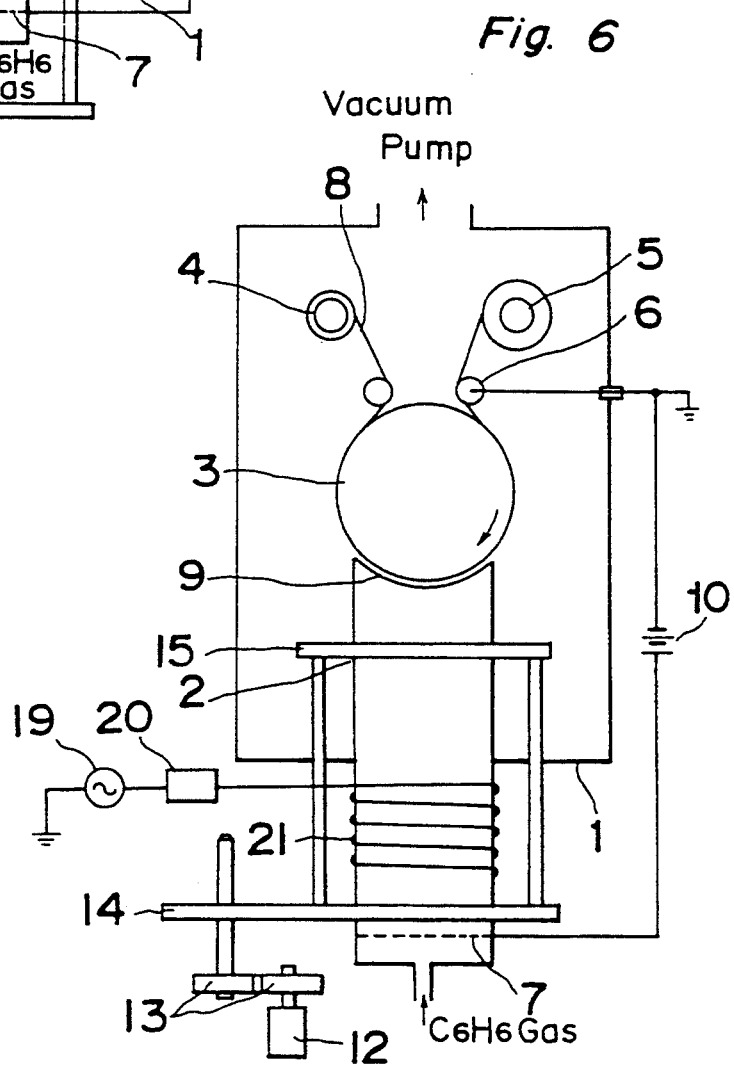
FIG. 6 is a schematic diagram of a further modified form of the plasma CVD apparatus shown in FIG. 3.

According to the modification shown in FIG. 6, that portion of the plasma generating tube 2 which protrudes outwardly from the vacuum vessel 1 is exteriorly wrapped with a high frequency coil 21 which is in turn electrically connected through a matching box 20 with an AC power source for applying an AC potential to the high frequency coil 21. If the plasma is produced by the application of the AC potential while the plasma generating tube 2 is disposed completely within the vacuum vessel 1, not only the interior of the plasma generating tube 2, but also the high frequency coil 21 will provide a trigger by which an abnormal discharge is likely to occur. This problem is obviated if the high frequency coil 21 is positioned outside the vacuum vessel 1 such as shown in FIG. 6 and, therefore, while the uniformity of the resultant film is ensured, the possibility of an abnormal discharge which would result in damage to the magnetic tape 8 can be eliminated.

Although the plasma CVD apparatus of the present invention has been described as carrying out the formation of the diamond-like carbon film on the surface of the magnetic layer of the magnetic tape, the apparatus of the present invention may be used in forming the diamond-like carbon film on substrates other than the magnetic tape. Also, the present invention is not limited to forming a diamond-like carbon film, but may be employed in forming any other thin film provided that the raw gaseous material and the film forming conditions are properly selected. The present invention can also be equally applied to the sputtering of a substrate surface with the use of an inert gas such as Ar gas and the oxidization or nitriding of a surface with the use of $O_2$ gas or $N_2$ gas.

Furthermore, by modifying the shape of the gas outflow port, the present invention can be used for forming a thin film on a three-dimensional substrate, an example of which will now be described in connection with a third preferred embodiment of the present invention with reference to FIG. 7. In describing the third embodiment of the present invention, reference is made to the synthesis of a diamond-like thin film on a surface of a sliding member employed in a machine for guiding a movement of a movable member. An example of this sliding member includes the one used to linearly guide tool carriage of a table-top machine tool. As is well known to those skilled in the art, the linear motion of the tool carriage directly affects the machining precision of a workpiece and is therefore maintained at a high level of preciseness. In view of this, a sliding surface supporting of the tool carriage must have a sufficient wear resistance and a sufficiently low coefficient of friction. The diamond-like thin film satisfies these requirements and, if it is formed on the sliding surface, an excellent sliding member can be obtained.

The present invention may also be used to form a diamond-like film on members other than the sliding member, such as a surface of a shaft supported by a slide bearing or any other bearing, a surface of any other tool or any other surface requiring wear resistance.

Figure 7:
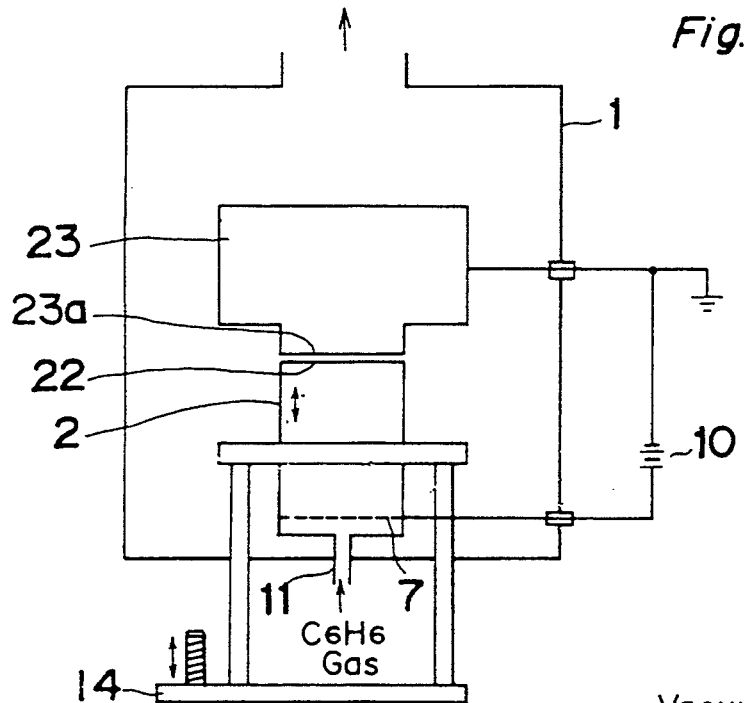
FIG. 7 is a schematic diagram of a third preferred embodiment of the plasma CVD apparatus according to the present invention.

The plasma CVD apparatus according to the present invention and shown in FIG. 7 may be advantageously employed for forming a diamond-like film on the surface of a sliding member 23. The plasma CVD apparatus shown therein comprises a vacuum chamber 1 in which the sliding member 23 is supported, and a plasma generating tube 2. The plasma generating tube 2 has a gas outflow port 22 so designed and so sized in consideration of the size of a film forming portion 23-a that the distance of separation between the sliding member 23 and the gas outflow port 22 is uniform over the entire area of the gas outflow port 22. In the illustrated embodiment, the film forming portion 23-a is flat and rectangular and, therefore, the gas outflow port 22 has a rectangular shape.

Figure 8:
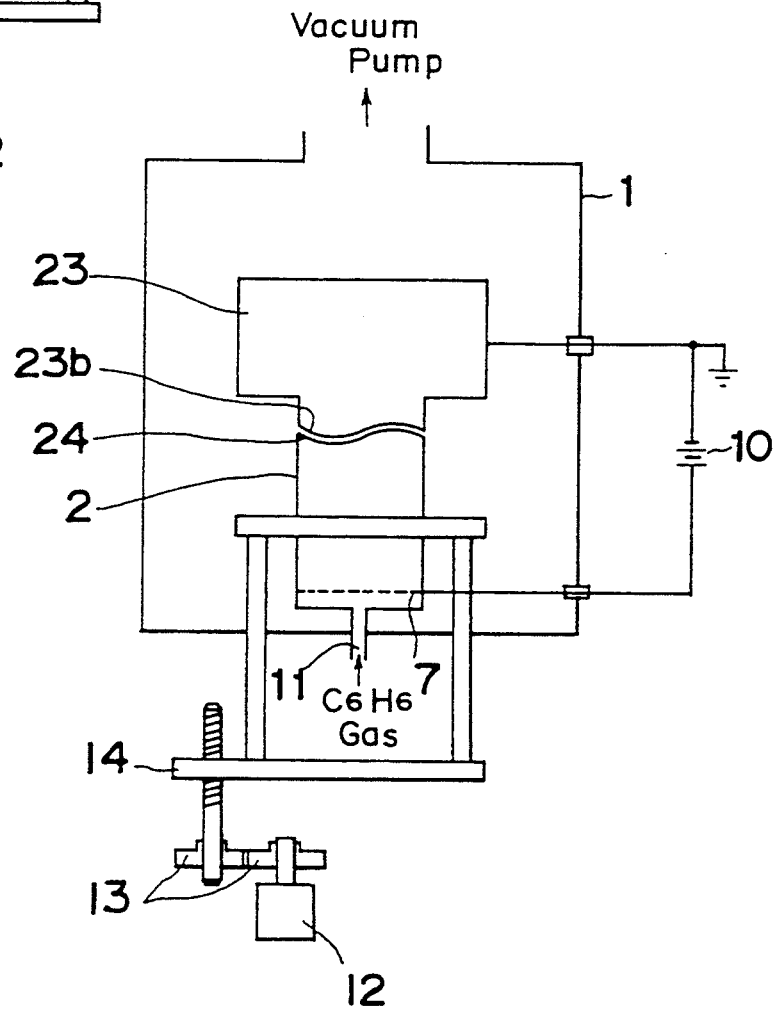
FIG. 8 is a schematic diagram of a modified forth of the plasma CVD apparatus shown in FIG. 7.
Figure 9:
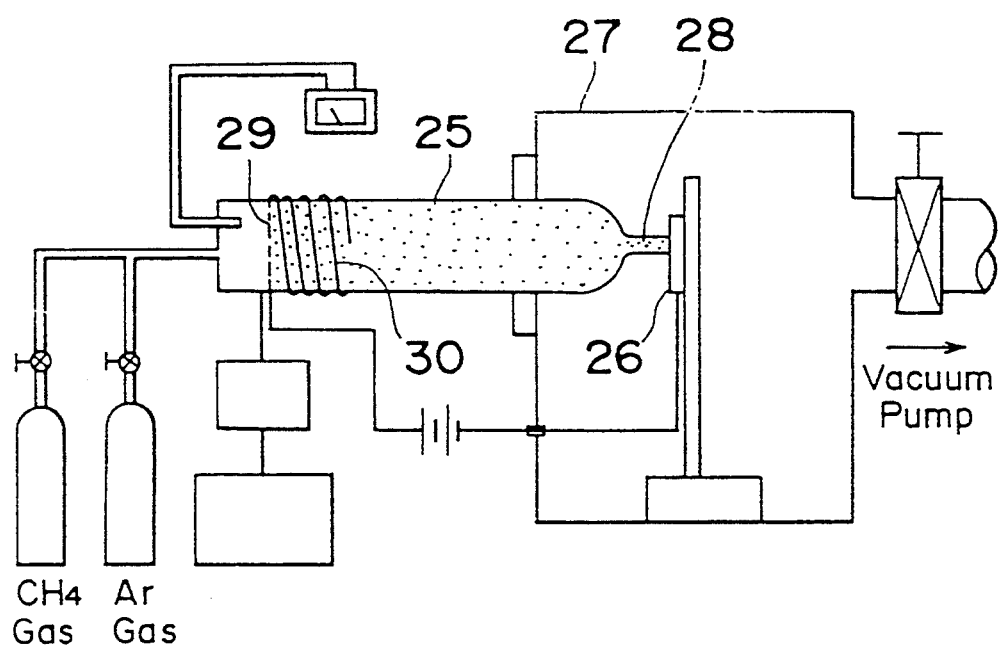
FIG. 9 is a schematic diagram of the prior art plasma CVD apparatus.

A substrate to be coated with the diamond-like film in accordance with the third embodiment of the present invention is not a band-like medium such as employed in the previously described embodiments, but a sliding member made of metal and is therefore fixed in position inside the vacuum vessel 1 during the formation of the diamond-like film on the surface of the sliding member 23. Hence, the third embodiment of the present invention does not require the use of the transport system such as required in any one of the foregoing embodiments of the present invention.

Where the surface on which the diamond-like film is to be formed is a curved surface such as shown by 24-b in FIG. 8, a gas outflow port 24 must be correspondingly shaped to follow the curved surface 23-b. Machine settings and operating means employed therein are substantially similar to those used in any one of the foregoing embodiments. As a raw gaseous material, $C_6H_6$ gas is used and is introduced into the plasma generating tube 2 through the gas supply line 11. At this time, the distance of separation between the gas outflow port 22 and the sliding member 23 and the flow rate of the $C_6 H_6$ gas are adjusted so that the pressure difference between the plasma generating tube 2 and the vacuum vessel 1 can attain a value in the order of more than a single figure. If this pressure difference is insufficient, not only is an uneven pressure developed at the gas outflow port 22, but also a portion of the plasma generated within the plasma generating tube 2 flows into the vacuum vessel 1, thereby causing a film to form at an unwanted area and an abnormal discharge.

After the pressure inside the plasma generating tube 2 has been stabilized, an electric potential required to cause the electrode 7 to have a positive potential is applied between the electrode 7 and the sliding member 23 to cause the plasma generating tube 2 to generate the plasma. Ions contained in the plasma so generated are accelerated by the effect of the potential difference between the electrode 7 and the sliding member 23 to impinge on the film forming portion 23-a of the sliding member 23 to thereby form a diamond-like carbon film together with radicals contained in the plasma.

One example of film forming conditions is shown in Table 3.

TABLE 3

| | |
|---|---|
| Pressure inside Tube 2 | 10 to 15 Pa |
| Pressure inside Vessel 1 | 0.1 Pa |
| $C_6H_6$ Flow Rate | 12 SCCM |
| Voltage of Power Source 10 | 3 kV |
| Current Density in Magnetic Layer | 0.1 mA/cm$^2$ |

As a result of the film formation under the above tabulated conditions, over the entire area of the gas outflow port 22 (50 mm in length and 80 mm in width), a film of 4,000 kg/mm$^2$ in Vickers hardness could be synthesized at a speed higher than 150 nm per minute. Consequently, it has become possible to form the diamond-like carbon film of 1 $\mu$m in thickness uniformly (with $\pm 2\%$ in variation in film thickness) over the film forming portion 23-a of the sliding member 23. It is to be noted that modifications described in connection with any one of the first and second preferred embodiments of the present invention can be equally employed in the practice of the third embodiment of the present invention.

In the illustrated embodiment, the potential difference between the electrode within the plasma generating tube 2 and the magnetic layer of the magnetic tape 8 or the sliding member 23 is chosen to be within a range of 0.3 to 5.0 kV and, preferably, within a range of 0.5 to 3.0 kV. If this potential difference is lower than 0.3 kV, the ion bombardment energy will be reduced resulting in a film similar to an organic film that is soft and easily be damaged. On the other hand, if the potential difference is higher than 5.0 kV, the ion bombardment energy will be excessive enough to sputter and/or damage the formed film.

The inside the vacuum vessel is preferably under a vacuum higher than 0.5 Pa and more preferably 0.2 Pa. If the vacuum inside the vacuum vessel is lower than 0.5 Pa, the potential applied to the magnetic layer may cause an abnormal discharge to take place within the vacuum vessel. Once the abnormal discharge occurs within the vacuum vessel, not only may foreign matter be undesirably deposited on the surface of the magnetic tape 8, but the magnetic layer of the magnetic tape may be damaged.

The pressure inside the plasma generating tube is preferably higher than 10 Pa and, more preferably within the range of 10 to 50 Pa. If the pressure inside the plasma generating tube is lower than 10 Pa, the film forming speed will be considerably reduced. On the other hand, if the pressure inside the plasma generating tube is higher than 50 Pa, the plasma generating tube is susceptible to an abnormal discharge when the potential is applied to the electrode. Also, an average stroke of free movement of ions is reduced accompanied by a reduction in bombardment energy and, therefore, the quality of the resultant film will be lowered (that is, the SP2 bonds are increased to provide a soft film).

Again, although reference has been made to the use of $C_6 H_6$ gas as the raw gaseous material, the present invention is not limited thereto, but may employ any gaseous medium provided that it contain carbon elements. The raw gaseous material used in the present invention may contain any one of Ar gas and $H_2$ gas.

While various embodiments of the present invention have fully been described, the present invention is characterized in that the distance of separation between the gas outflow port and surface of the substrate on which the film is desired to be formed is so chosen that the pressure of the plasma generated by the plasma generating tube 2 and emerging outwardly through the gas outflow port into the first vacuum vessel 1 is uniform over the entire area of the gas outflow port, that is, at any location over the gas outflow port. If the distance of separation is great as compared with the rate of flow of the gas emerging outwardly through the gas outflow port, the flow of the gas emerging from the gas outflow port is so unstable that no uniform pressure can be created in the gap between the gas outflow port and the substrate.

When the distance of separation between the gas outflow port and the substrate is chosen to be a proper value, the amount of gas emerging outwardly from the gas outflow port of the plasma generating tube is so small compared to the amount of plasma generated within the plasma generating tube that not only is a sufficient amount of the plasma accumulated within the plasma generating tube, but the gas pressure thereof is increased. Consequently, while a proper amount of the plasma is accumulated in the plasma generating tube, the amount of the plasma generated and the amount of the plasma flowing outwardly from the tube are properly balanced with each other to such an extent that the plasma is stably supplied to the gap and the pressure in the gap is maintained uniform.

In the practice of the present invention, the pressure inside the plasma generating tube is higher than that inside the first vacuum vessel. It has, however, been found that, in order to create uniform gas pressure over the entirety of the gap between the substrate and the gas outflow port in order to form a high quality film, the pressure inside the plasma generating tube, that is, the second vacuum vessel, should be higher on the order of one, or preferably one to two, figures than the pressure inside the first vacuum vessel.

Although the present invention has been described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims, unless they otherwise depart therefrom.

What is claimed is:

1. A plasma CVD apparatus for forming a film on a substrate, said apparatus comprising:
   a first vacuum vessel;
   a substrate support which positions the substrate within said first vacuum vessel;
   a second vacuum vessel fluid-connected with a source of a raw gaseous medium, said second vacuum vessel having a gas outflow port having a shape conforming to the shape of the surface of at least a portion of the substrate positioned within said first vacuum vessel by said substrate support, at least a portion of said second vacuum vessel being accommodated within said first vacuum vessel with the gas outflow port oriented towards the location at which said at least a portion of the surface of the substrate is positioned in the first vacuum vessel;
   plasma generating means for transforming the raw gaseous medium introduced into the second vacuum vessel into plasma within the second vacuum vessels;
   a positioning mechanism which supports said second vacuum vessel with the gas outflow port spaced such a distance from the location at which said at least a portion of the surface of the substrate is positioned in the first vacuum vessel that the pressure of plasma discharged from the gas outflow port will be uniform over the entirety of a gap defined between said gas outflow port and said location; and
   electric field generating means for directing ions of the plasma, discharged from the gas outflow port into the gap, towards said location at which at least a portion of the surface of the substrate is positioned within the first vacuum vessel.

2. The plasma CVD apparatus as claimed in claim 1, wherein said positioning mechanism comprises movable means for moving the second vacuum vessel to adjust a width of the gap between said location at which at least a portion of the surface of the substrate is positioned in the first vacuum vessel and the gas outflow port.

3. The plasma CVD apparatus as claimed in claim 1, wherein said substrate support comprises movable means for moving the substrate to vary a width of the gap between said location at which at least a portion of the surface of the substrate is positioned within the first vacuum vessel and the gas outflow port.

4. The plasma CVD apparatus as claimed in claim 1 for forming the film on a substrate in the form of a continuous length of magnetic tape, wherein said substrate support includes a rotatably supported drum disposed within said first vacuum vessel, and magnetic tape transport means for transporting the magnetic tape over the drum, said gas outflow port has a shape complementary to part of an outer peripheral surface of the drum, said electric field generating means comprises a bias potential applicator which applies an electrical bias to a magnetic layer of the magnetic tape supported by said drum, and said plasma generating means comprises an electrode disposed in said second vacuum vessel, said electrode cooperating with said bias applicator to form the electric field for directing the ions of the plasma towards the magnetic tape supported by said drum.

5. The plasma CVD apparatus as claimed in claim 4 wherein said positioning mechanism comprises movable means for moving the second vacuum vessel to adjust a width of the gap between said location at which at least a portion of the surface of the substrate is positioned in the first vacuum vessel and the gas outflow port.

6. A method of forming, by the use of a plasma CVD technique, a film on a surface of a substrate within a vacuum vessel, which method comprises the steps of:
   supplying plasma into the vacuum vessel under a pressure higher than the pressure inside the vacuum vessel;
   developing an electric field which will direct ions of the plasma towards the substrate; and
   forming the film of elements of the plasma;
   said step of supplying plasma comprising passing the plasma through a plasma gas outflow port having a shape conforming to the shape of the surface of the substrate and spaced such a distance from the surface of the substrate that the pressure of the plasma, within the gap defined between the plasma gas outflow port and the surface of the substrate, is substantially uniform and higher than the pressure inside the vacuum vessel;

said step of developing an electric field is carried out in such a manner that the plasma within the gap is subjected to the electric field.

7. The method of forming a film as claimed in claim 2, wherein said step of supplying plasma comprises supplying plasma into the vacuum vessel at a pressure within the range of 10 to 50 Pa and regulating the pressure inside the vacuum vessel to a pressure lower than 0.2 Pa.

8. The film forming method as claimed in claim 6, wherein the substrate is a continuous length of magnetic tape having a magnetic layer thereon, wherein said step of forming comprises forming the film on the magnetic layer of the magnetic tape, and further comprising transporting the magnetic tape within the vacuum chamber over a drum, and wherein said step of supplying plasma comprises passing the plasma through a plasma gas outflow port having a shape complementary to the shape of a portion of an outer peripheral surface of the drum.

9. The method of forming a film as claimed in claim 8, wherein said step of supplying plasma comprises supplying a gaseous version of a gaseous medium containing carbon to the vacuum vessel, and said step of forming the film comprises forming a diamond-like film on the magnetic layer of the magnetic tape.

10. The method of forming a film as claimed in claim 9, wherein said step of supplying plasma comprises supplying plasma into the gap under a pressure within the range of 10 to 50 Pa and regulating the pressure inside the vacuum vessel to a pressure lower than 0.2 Pa.

* * * * *